United States Patent
Miura et al.

(10) Patent No.: US 10,458,720 B2
(45) Date of Patent: Oct. 29, 2019

(54) HEAT TRANSFER DEVICE

(71) Applicant: FURUKAWA ELECTRIC CO., LTD., Tokyo (JP)

(72) Inventors: Tatsuro Miura, Tokyo (JP); Yoshikatsu Inagaki, Tokyo (JP); Hiroshi Okada, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/579,698

(22) PCT Filed: Jul. 22, 2015

(86) PCT No.: PCT/JP2015/070799
§ 371 (c)(1),
(2) Date: Dec. 5, 2017

(87) PCT Pub. No.: WO2017/013761
PCT Pub. Date: Jan. 26, 2017

(65) Prior Publication Data
US 2018/0172360 A1     Jun. 21, 2018

(51) Int. Cl.
*F28D 15/04*     (2006.01)
*F28D 15/02*     (2006.01)
(Continued)

(52) U.S. Cl.
CPC ....... *F28D 15/046* (2013.01); *F28D 15/0233* (2013.01); *F28F 1/30* (2013.01);
(Continued)

(58) Field of Classification Search
CPC . F28D 15/046; F28D 15/0233; H01L 23/427; H05K 7/20336
(Continued)

(56) References Cited

U.S. PATENT DOCUMENTS 3,754,594 A * 8/1973 Ferrell ................ F28D 15/046
165/104.26
4,138,995 A * 2/1979 Yuan ................... F28D 15/0233
126/620
(Continued)

FOREIGN PATENT DOCUMENTS

CN     202614050 U     12/2012
JP     02-115692 A     4/1990
(Continued)

OTHER PUBLICATIONS

Office Action dated Jul. 23, 2018 in Chinese Patent Application No. 201590001441.1, (with English translation), 3 pages.
(Continued)

*Primary Examiner* — Jianying C Atkisson
*Assistant Examiner* — Joel M Attey
(74) *Attorney, Agent, or Firm* — Oblon, McClelland, Maier & Neustadt, L.L.P.

(57) ABSTRACT

A heat transfer device includes a heat pipe in which working fluid is enclosed, a heat receiving plate provided on one end side of the heat pipe and a heat radiating fin provided on the other end side of the heat pipe, a first wick and a second wick that transfer working fluid provided on an inner wall surface of the heat pipe, a bent section bent between the one end side and the other end side, and a boundary section between the first wick and the second wick disposed in a lower part in the gravity direction of the bent section of the heat pipe or the heat transfer device. The heat transfer device can improve heat transfer characteristics with a simple configuration.

9 Claims, 14 Drawing Sheets

(51) Int. Cl.
*F28F 1/42* (2006.01)
*H05K 7/20* (2006.01)
*F28F 1/30* (2006.01)
*H01L 23/427* (2006.01)
*F28F 3/02* (2006.01)
*H01L 23/367* (2006.01)

(52) U.S. Cl.
CPC .............. *F28F 1/42* (2013.01); *H01L 23/427* (2013.01); *H05K 7/20336* (2013.01); *F28F 3/02* (2013.01); *F28F 2215/02* (2013.01); *F28F 2255/18* (2013.01); *F28F 2275/06* (2013.01); *H01L 23/367* (2013.01)

(58) Field of Classification Search
USPC ........................................ 165/104.26, 104.33
See application file for complete search history.

(56) References Cited

U.S. PATENT DOCUMENTS

| | | | | |
|---|---|---|---|---|
| 5,052,476 | A * | 10/1991 | Sukumoda | B21B 1/227 138/38 |
| 6,241,008 | B1 | 6/2001 | Dunbar | |
| 7,137,443 | B2 * | 11/2006 | Rosenfeld | B22F 3/1103 165/104.26 |
| 9,578,781 | B2 * | 2/2017 | Slippey | H05K 7/20336 |
| 2006/0185828 | A1 * | 8/2006 | Takehara | F28D 1/0226 165/104.26 |
| 2007/0240859 | A1 | 10/2007 | Wang et al. | |
| 2011/0174466 | A1 * | 7/2011 | Liu | H01L 23/427 165/104.26 |
| 2012/0118537 | A1 | 5/2012 | Kameoka et al. | |
| 2013/0213611 | A1 * | 8/2013 | Wu | F28D 15/0233 165/104.26 |
| 2016/0033206 | A1 | 2/2016 | Kameoka et al. | |

FOREIGN PATENT DOCUMENTS

| | | |
|---|---|---|
| JP | 02-77474 U | 6/1990 |
| JP | 10-96593 A | 4/1998 |
| JP | 2001-108384 A | 4/2001 |
| JP | 2002-081875 A | 3/2002 |
| JP | 2003-214779 A | 7/2003 |
| JP | 2003-247791 A | 9/2003 |
| JP | 2011-226743 A | 11/2011 |
| JP | 2012-154622 A | 8/2012 |
| JP | 2013-195001 A | 9/2013 |
| TW | 327463 | 2/2008 |
| TW | 320093 | 2/2010 |
| TW | 394927 B1 | 5/2013 |

OTHER PUBLICATIONS

International Search Report dated Oct. 6, 2015 in PCT/JP2015/070799 Filed Jul. 22, 2015.
Japanese Office Action dated Jan. 13, 2015 in Application No. JP 2014-036878 (with English translation).
Taiwanese Office Action dated Nov. 8, 2016 in Application No. TW 104124741(with English translation).
International Preliminary Report on Patentability and Written Opinion dated Feb. 1, 2018 in PCT/JP2015/070799 (with English language translation).

* cited by examiner

HEAT TRANSFER DEVICE

TECHNICAL FIELD

The present invention relates to a heat transfer device in which a heat receiving section is provided on one end side of a heat pipe and a heat radiating section is provided on the other end side of the heat pipe.

BACKGROUND ART

In general, there is known a heat transfer device including a heat pipe in which working fluid is enclosed in a container, a heat receiving section being provided on one end side of the heat pipe and a heat radiating section being provided on the other end side of the heat pipe. In the heat transfer device of this type, the working fluid repeats evaporation and condensation and refluxes in the container, whereby heat transfer is performed. That is, the working fluid evaporates on the heat receiving section side in the container and the evaporated working fluid moves to a heat radiation side in the container according to a pressure difference. The evaporated working fluid is condensed on the heat radiation side to be liquid. The working fluid refluxes to the heat receiving section side with capillarity of a wick provided on the inner wall of the container. In this way, in the heat transfer device including the heat pipe, the apparent heat conductivity of the container is approximately several times to several ten times more excellent than the apparent heat conductivity of metal such as copper or aluminum. Therefore, the heat transfer device is mounted on an electronic apparatus such as a personal computer and used for cooling of cooling target components such as a CPU.

Incidentally, depending on a position of the heat receiving section where the cooling target component is provided, the heat pipe of this type is classified into top heat in which the heat receiving section is disposed in an upper part in the gravity direction and bottom heat in which the heat receiving section is disposed in a lower part in the gravity direction. When the heat pipe is disposed in the top heat, since the reflux of the working fluid to the heat receiving section present in a high position is prevented by the gravity, a heat transfer amount greatly decreases.

As a method for solving this problem, there has been proposed a configuration in which a vibrator is attached to the heat pipe to assist the reflux of the working fluid to the heat receiving section provided upward in the gravity direction (see, for example, Patent Literature 1).

CITATION LIST

Patent Literature

Patent Literature 1: Japanese Patent Application Laid-Open No. H2-115692

SUMMARY OF INVENTION

Technical Problem

However, in the conventional technique described in Patent Literature 1, a complicated mechanism is necessary because the vibrator is provided. Further, there is a problem in that the capacity of the container (the heat pipe) greatly increases. Consequently, since the entire heat transfer device increases in size, it is difficult to mount the heat transfer device on a small electronic apparatus such as a personal computer.

The present invention has been devised in order to solve the problems, and an object of the present invention is to provide a heat transfer device that can achieve improvement of heat transfer characteristics with a simple configuration.

Solution to Problem

In order to achieve the object, the present invention provides a heat transfer device including: a heat pipe in which working fluid is enclosed; a heat receiving section being provided on one end side of the heat pipe; and a heat radiating section being provided on another end side of the heat pipe. On an inner wall of the heat pipe, a first wick having a relatively large capillary pressure is disposed in the heat receiving section of the heat pipe and a second wick having relatively small flow resistance is disposed in the heat radiating section of the heat pipe. A bent section bent between the heat receiving section and the heat radiating section is provided. A boundary section between the first wick and the second wick is disposed below the bent section in a gravity direction. The heat receiving section is disposed above the bent section in the gravity direction.

In this configuration, the second wick may include a plurality of groove sections extending in a longitudinal direction on the inner wall of the heat pipe.

The depth of the groove sections may be set to 0.10 to 0.20 mm. The depth of the groove sections may be a depth of 30 to 70% with respect to the thickness of the heat pipe.

The first wick may include porous sintered metal obtained by sintering a spherical powder or deformed powder. The second wick may include a metal braded wire or a fine metal net. The second wick may include, in a width direction center of the heat pipe, porous sintered metal obtained by sintering a spherical powder or deformed powder. Steam channels may be formed on left and right sides inside the heat pipe across the porous sintered metal. The second wick may include, in the width direction center of the heat pipe, one or more semielliptical porous sintered metals obtained by sintering a spherical powder or deformed powder. A flat section of each semielliptical porous sintered metal may be disposed on the inner wall of the heat pipe. Steam channels may be formed on left and right sides inside the heat pipe across the semielliptical porous sintered metals.

The other end side of the heat pipe may be pressed and flattened to be relatively thinner than the one end side of the heat pipe. The working fluid may be stored in a boundary section between the plurality of types of wicks.

Advantageous Effects of Invention

According to the present invention, the heat pipe includes, on the inner wall, the plurality of types of wicks for transferring the working fluid. Since the boundary section between the plurality of types of wicks is disposed below the bent section of the heat transfer device in the gravity direction, the boundary section is soaked by the working fluid flowing down with the gravity. Therefore, the reflux of the working fluid to the one end side of the heat pipe where the heat receiving section is provided is facilitated. Consequently, it is possible to improve heat transfer efficiency with a simple configuration. Since the heat pipe includes the bent section bent between the one end side and the other end side, it is possible to easily store the working fluid in the bent section.

DESCRIPTION OF EMBODIMENTS

An embodiment of the present invention is explained below with reference to the drawings.

Figure 1:
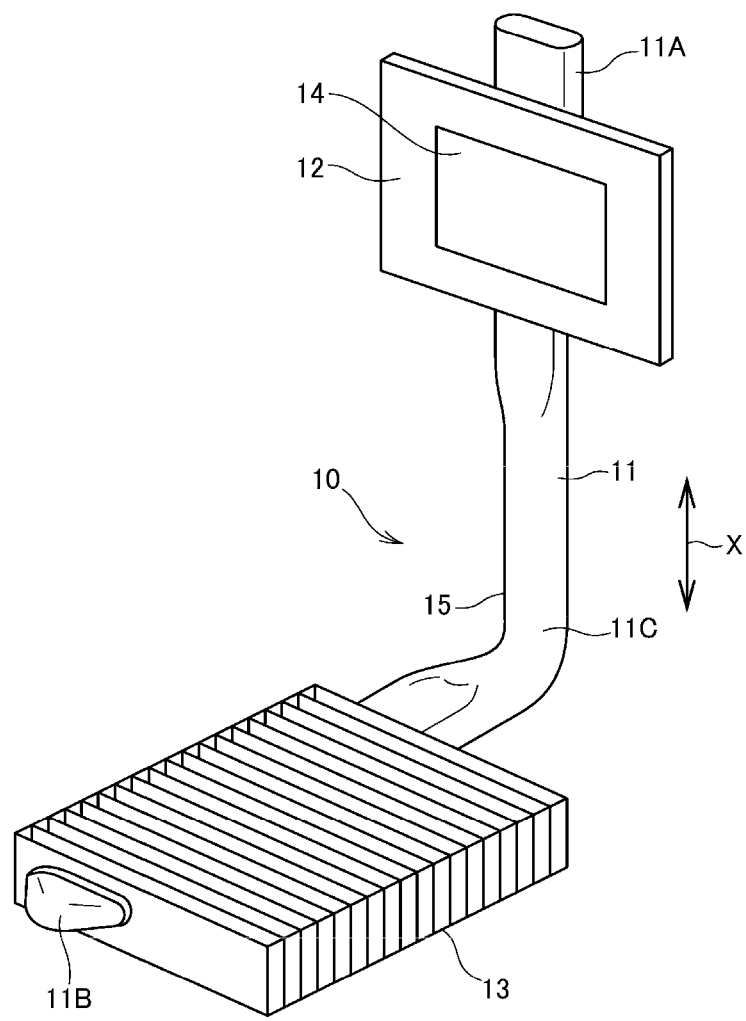
FIG. 1 is a perspective view of a heat transfer device of an embodiment.

FIG. 1 is a perspective view showing a heat transfer device 10 according to this embodiment.

The heat transfer device 10 according to this embodiment cools various heat generating elements 14 such as a CPU and a semiconductor memory mounted on a personal computer, an information household electrical appliance, or the like.

The heat transfer device 10 includes, as shown in FIG. 1, a heat pipe 11, a heat receiving plate (a heat receiving section) 12 provided on one end 11A side of the heat pipe 11, and a heat radiating fin (a heat radiating section) 13 provided on the other end 11B side of the heat pipe 11. A heat generating element 14 functioning as a cooling target component is attached to the heat receiving plate 12.

The heat pipe 11 includes a container 15, the inside of which is configured in a hollow shape and which is made of a metal material excellent in thermal conductivity, for example, aluminum, an aluminum alloy, or copper. Working fluid 24 (FIG. 2) is enclosed in the container 15.

The heat pipe 11 includes, as shown in FIG. 1, a bent section 11C bent at a substantially right angle between the one end 11A and the other end 11B. The one end 11A of the heat pipe 11 extends vertically upward from the bent section 11C. That is, the heat pipe 11 of this embodiment is in a so-called top heat mode in which the heat receiving plate 12 is disposed in an upper part in the gravity direction. The bent section 11C is disposed in a lower part in the gravity direction.

In the heat pipe 11, the one end 11A and the other end 11B are formed in a flat shape (a substantially elliptical shape in section). The heat pipe 11 is in contact with the heat receiving plate 12 and the heat radiating fin 13 in wide ranges and to be capable of exchanging heat. The bent section 11C is formed in a cylindrical shape. A large heat transfer space is provided on the inside of the bent section 11C. In this embodiment, the container 15 having a cylindrical shape is bent halfway to form the bent section 11C. Press flat machining is applied to the one end 11A and the other end 11B.

The heat receiving plate 12 is attached to the one end 11A of the heat pipe 11 by means such as welding, brazing, or soldering. The other end 11B of the heat pipe 11 is pierced through a hole section formed in the heat radiating fin 13 and is fixed.

The heat receiving plate 12 is made of a metal plate of aluminum metal or the like. The heat radiating fin 13 includes a plurality of fin plates formed in a substantially C shape in section by bending both side edges of metal plates of aluminum or the like substantially in parallel to one another. The fin plates are disposed side by side in an extending direction of the heat pipe 11. The fin plates are integrally fixed by soldering.

Figure 2:
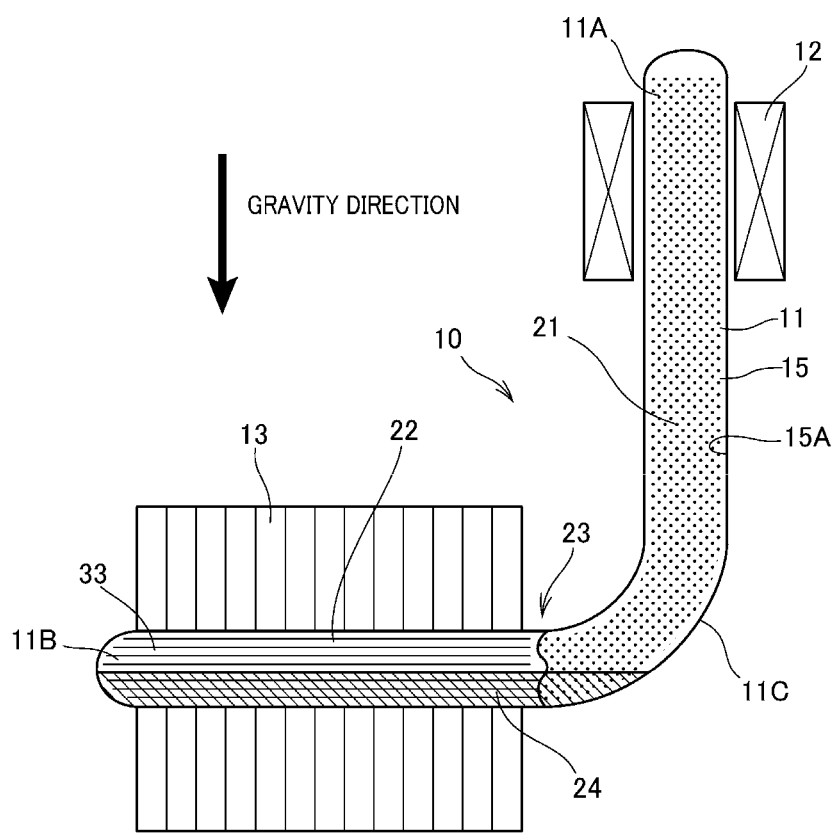
FIG. 2 is a diagram schematically showing an internal structure of the heat transfer device.
Figure 3:
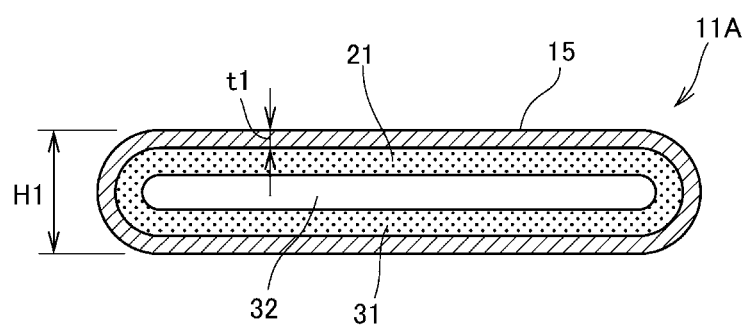
FIG. 3 is a sectional view of one end side of a heat pipe.
Figure 4:
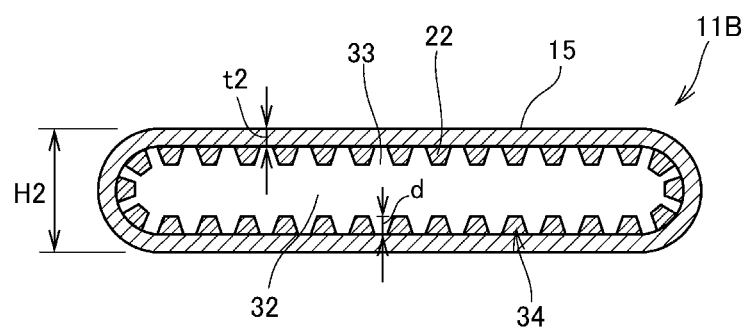
FIG. 4 is a sectional view of the other end side of the heat pipe.

FIG. 2 is a diagram schematically showing an internal structure of the heat transfer device 10. FIG. 3 is a sectional view on the one end 11A side of the heat pipe 11. FIG. 4 is a sectional view on the other end 11B side of the heat pipe 11.

The working fluid 24 is enclosed in the inside of the container 15. On an inner wall surface 15A (an inner wall) of the container 15, as shown in FIG. 2, a first wick 21 and a second wick 22 for transferring the enclosed working fluid 24 with capillary pressure are provided.

The first wick 21 and the second wick 22 are wicks of types different from each other. The first wick 21 is provided along the longitudinal direction of the heat pipe 11 (the container 15) from the one end 11A side of the heat pipe 11. The second wick 22 is provided along the longitudinal direction of the heat pipe 11 (the container 15) from the other end 11B side of the heat pipe 11. A boundary section 23 between the first wick 21 and the second wick 22 is provided to be located in the bottom in the bent section 11C of the heat pipe 11.

Therefore, in the boundary section 23, the working fluid 24 condensed in the heat pipe 11 accumulates. The working fluid 24 always soaks the first wick 21 connected to the boundary section 23.

The first wick 21 is a wick having relatively large capillary pressure. In this embodiment, as shown in FIG. 3, the first wick 21 includes, on the inner wall surface 15A, porous sintered metal 31 obtained by sintering a spherical metal powder or deformed metal powder having a particle diameter of approximately 45 to 200 μm. The working fluid 24 soaking the porous sintered metal 31 permeates upward in a gap of the porous sintered metal 31 with capillary pressure and reaches the heat receiving plate 12. An internal space surrounded by the porous sintered metal 31 forms a steam channel 32 in which working fluid steam evaporated by heat supplied from the heat receiving plate 12 (FIG. 1) flows.

The second wick 22 is a wick having relatively small flow resistance and relatively high permeability. In this embodiment, the second wick 22 is configured as a groove wick 34 including a plurality of groove sections 33 extending in the longitudinal direction on the inner wall surface 15A. The working fluid 24 condensed by the heat radiating fin 13 reaches the boundary section 23 through the groove sections 33. In this case, a lead angle of the groove sections 33 (grooves) with respect to the longitudinal direction of the heat pipe 11 (the container 15) is desirably set in a range of 0 degree to 20 degrees.

In this embodiment, as shown in FIG. 3 and FIG. 4, height H1 of the one end 11A of the heat pipe 11 is formed larger than height H2 of the other end 11B. Further, thickness t1 of the container 15 at the one end 11A is formed relatively larger than thickness t2 on the other end 11B side.

According to this embodiment, in the heat transfer device 10 including the heat pipe 11 in which the working fluid 24 is enclosed, the heat receiving plate 12 being provided on the one end 11A side of the heat pipe 11 and the heat radiating fin 13 being provided at the other end 11B, the heat pipe 11 includes the bent section 11C bent between the one end 11A side and the other end 11B side. The bent section 11C is disposed in the lower part in the gravity direction. Therefore, the working fluid 24 easily accumulates in the bent section 11C. Further, the first wick 21 and the second wick 22 for transferring the working fluid 24 are provided on the inner wall of the heat pipe 11. The boundary section 23 between the first wick 21 and the second wick 22 is disposed in the bent section 11C. Therefore, the boundary section 23 between the first wick 21 and the second wick 22 is soaked by the working fluid 24 accumulated in the bent section 11C. Therefore, with the capillary pressure of the first wick 21, the first wick 21 plays a role of a pump that refluxes the working fluid 24 to a high position and the second wick 22 plays a role of a water feed pipe for quickly feeding the working fluid 24 from a liquid reservoir to the first wick 21. Efficient working fluid circulation is performed. Consequently, reflux of the working fluid 24 to the one end 11A side of the heat pipe 11, where the heat receiving plate 12 is provided, is facilitated. Therefore, it is possible to improve heat transfer efficiency with a simple configuration.

According to this embodiment, the first wick 21 having the relatively large capillary pressure is disposed on the one end 11A side of the heat pipe 11 and the second wick 22 having the relatively small flow resistance is disposed on the other end 11B side of the heat pipe 11. Therefore, for example, even in the disposition configuration by the top heat mode in which the heat receiving plate 12 is disposed in the upper part in the gravity direction, it is possible to efficiently reflux the working fluid 24 to the one end 11A side of the heat pipe 11.

According to this embodiment, the first wick 21 includes the porous sintered metal 31 obtained by sintering the spherical powder or deformed powder. Therefore, it is possible to form a wick having relatively large capillary pressure with a single configuration.

According to this embodiment, the second wick 22 includes the plurality of groove sections 33 extending in the longitudinal direction on the inner wall surface 15A of the heat pipe 11. Therefore, it is possible to form a wick having relatively small flow resistance with a simple configuration.

Examples are explained below.

EXAMPLE 1

As the container 15 of the heat pipe 11, a cylindrical container having an outer diameter of 10 mm, a thickness of 0.3 mm, and a length of 260 mm was used. The one end 11A side of the heat pipe 11 (the container 15) was pressed and flattened to thickness H1 of 4.0 mm and the other end 11B side of the heat pipe 11 (the container 15) was pressed and flattened to thickness H2 of 2.5 mm. The heat receiving plate 12 made of copper metal was disposed on the one end 11A side. The heat radiating fin 13 made of aluminum having a length of 100 mm was disposed on the other end 11B side.

On the inner wall surface 15A of the container 15, as the first wick 21, the porous sintered metal 31 was disposed on the one end 11A side such that thickness was 1.3 mm and the height of the steam channel 32 was 0.8 mm. On the other end 11B side, as the second wick 22, the porous sintered metal 31 was disposed such that thickness was 0.7 mm and the height of the steam channel 32 was 0.5 mm.

The heat pipe 11 included the bent section 11C between the one end 11A and the other end 11B. The boundary section 23 made of two kinds of the porous sintered metal 31 was formed to be the bent section 11C. In this state, a heater having size of 16 mm×16 mm was attached to the heat receiving plate 12. A maximum heat transfer amount and heat resistance between the heater and a room temperature were respectively measured.

The maximum heat transfer amount is a maximum heat quantity that the heat pipe 11 can transfer and refers to a maximum value with which the working fluid 24 does not dry out in the heat pipe 11.

Temperature on the one end 11A side functioning as an evaporating section and temperature on the other end 11B side functioning as a condensing section are measured. When a difference between the temperatures is equal to or larger than a predetermined temperature difference, it is determined that the working fluid 24 has dried out. A heater heat quantity immediately before the working fluid 24 having dried out was measured.

The heat resistance between the heater and the room temperature is a value obtained by dividing a differential temperature between a heater temperature and a room temperature (an ambient temperature) during maximum heat transfer by the maximum heat transfer amount. The value was measured and calculated.

EXAMPLE 2

Compared with Example 1, Example 2 is different in that the porous sintered metal 31 configuring the first wick 21 was disposed such that thickness was 1.0 mm and the height of the steam channel 32 was 1.4 mm. Since the other configuration is the same as the configuration in Example 1, explanation of the configuration is omitted.

EXAMPLE 3

Example 3 is different from Example 1 in that the second wick 22 provided on the other end 11B side of the heat pipe 11 is not a wick made of the porous sintered metal 31 but is the groove wick 34 including the plurality of groove sections 33 extending in the longitudinal direction. The other configuration is the same as the configuration in Example 1.

In Example 3, depth d of the groove sections 33 (the grooves) was formed to be 0.25 mm and the height of the steam channel 32 was formed to be 1.4 mm. Note that, since the thickness H2 on the other end 11B side is 2.5 mm, the thickness t2 of the heat pipe 11 (the container 15) on the other end 11B side is 0.3 mm. Therefore, a ratio of the depth d of the groove sections 33 (the grooves) to the thickness t2 of the heat pipe 11 (the container 15) is 83.3%.

EXAMPLE 4

Example 4 is different from Example 3 in that the depth d of the groove sections 33 (the grooves) in the second wick 22 was set to 0.20 mm and the height of the steam channel 32 was set to 1.5 mm. The other configuration is the same as the configuration in Example 3.

In Example 4, a ratio of the depth d of the groove sections 33 (the grooves) to the thickness t2 of the heat pipe 11 (the container 15) is 66.7%.

EXAMPLE 5

Example 5 is different from Example 4 in that the porous sintered metal 31 configuring the first wick 21 was disposed such that the thickness was 1.0 mm and the height of the steam channel 32 was 1.4 mm. The other configuration is the same as the configuration in Example 4.

EXAMPLE 6

Example 6 is different from Example 3 in that the depth d of the groove sections 33 (the grooves) in the second wick 22 was set to 0.15 mm and the height of the steam channel 32 was set to 1.6 mm. The other configuration is the same as the configuration in Example 3.

In Example 6, a ratio of the depth d of the groove sections 33 (the grooves) to the thickness t2 of the heat pipe 11 (the container 15) is 50%.

EXAMPLE 7

Example 7 is different from Example 3 in that the depth d of the groove sections 33 (the grooves) in the second wick 22 was set to 0.10 mm and the height of the steam channel 32 was set to 1.7 mm. The other configuration is the same as the configuration in Example 3.

In Example 7, a ratio of the depth d of the groove sections 33 (the grooves) to the thickness t2 of the heat pipe 11 (the container 15) is 33.3%.

Values of the maximum heat transfer amount and the heat resistance between the heater and the room temperature in Examples 1 to 7 are shown in Table 1.

ing in the longitudinal direction was provided as the second wick 22, in the configuration in which the depth d of the groove section 33 was set to 0.10 to 0.20 mm, the maximum heat transfer amount is 110 W or more and the heat resistance between the heater and the room temperature is 0.70° C./W or less.

Therefore, it is possible to achieve further improvement of the heat transfer characteristics by setting the depth d of the groove sections 33 to a depth of 30 to 70% with respect to the thickness of the heat pipe 11 rather than setting the depth d of the groove sections 33 at random.

A configuration is explained in which the position of the boundary section 23 between the first wick 21 and the second wick 22 is changed.

EXAMPLE A

Figure 5:
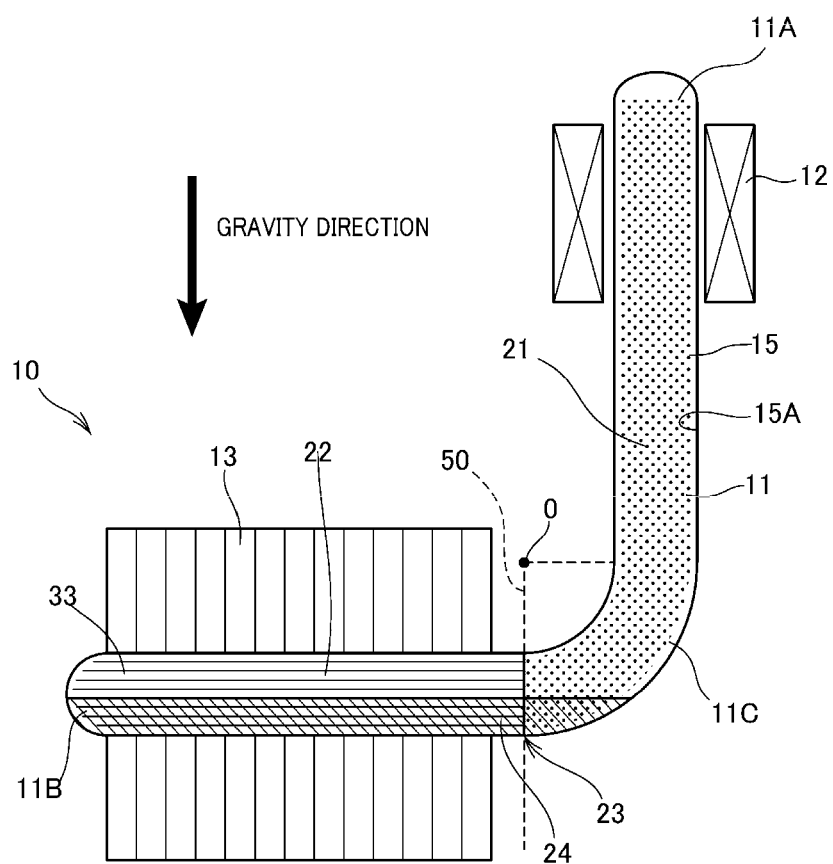
FIG. 5 is a schematic diagram of an internal structure of a heat transfer device according to Example A.

FIG. 5 is a schematic diagram of an internal structure of a heat transfer device according to Example A.

In Example A, the boundary section 23 between the first wick 21 and the second wick 22 is provided in a position of 0 degree in the gravity direction with respect to the bent section 11C. Specifically, the boundary section 23 is provided such that an angle formed by a reference line 50 extending in the gravity direction (downward in the vertical direction) from a bending center O of the bent section 11C and the boundary section 23 is 0 degree, that is, the boundary section 23 is located on the reference line 50.

The configuration other than the position of the boundary section 23 of the heat pipe 11 is the same as the configuration in Example 5 explained above.

EXAMPLE B

Figure 6:
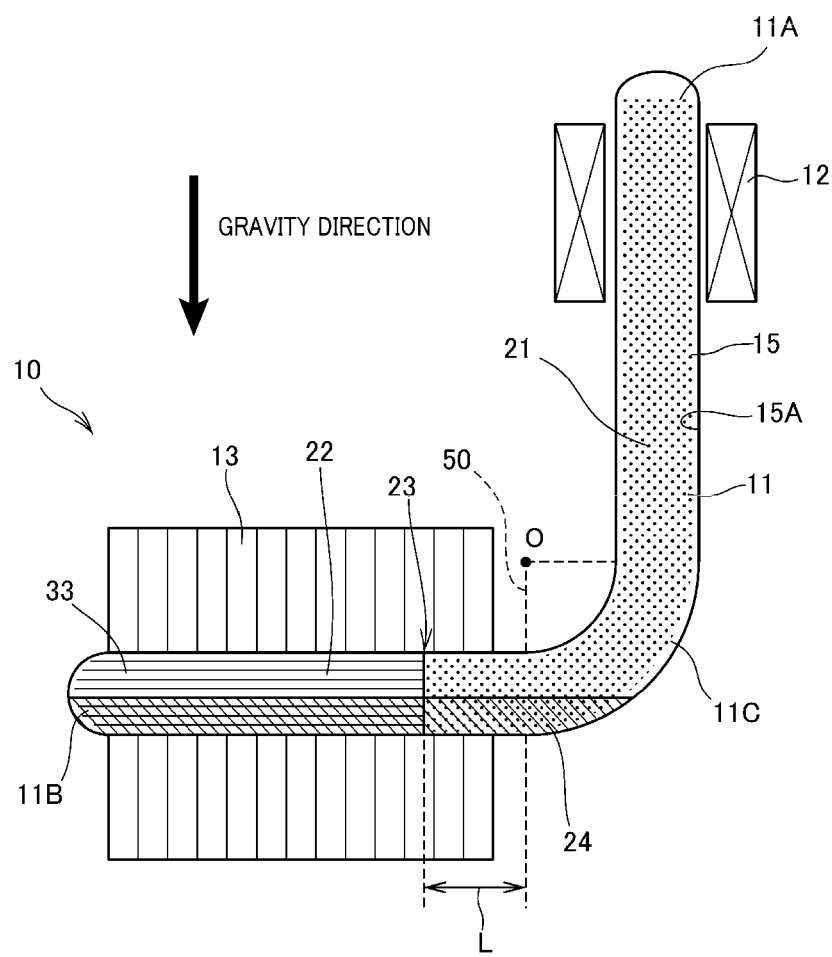
FIG. 6 is a schematic diagram of an internal structure of a heat transfer device according to Example B.

FIG. 6 is a schematic diagram of an internal structure of a heat transfer device according to Example B.

TABLE 1

| | One end (heat receiving section) side Thickness 4.0 mm Wick type | | The other end (condensing section) side Thickness 2.5 mm Wick type | | Maximum heat transfer amount | Heat resistance between the heater and the room temperature |
|---|---|---|---|---|---|---|
| Example 1 | Sintered metal thickness | 1.3 mm | Sintered metal thickness | 0.7 mm | 80 W | 0.84° C./W |
| | Steam channel height | 0.8 mm | Steam channel height | 0.5 mm | | |
| Example 2 | Sintered metal thickness | 1.0 mm | Sintered metal thickness | 0.7 mm | 80 W | 0.92° C./W |
| | Steam channel height | 1.4 mm | Steam channel height | 0.5 mm | | |
| Example 3 | Sintered metal thickness | 1.3 mm | Sintered metal thickness | 0.25 mm | 90 W | 0.88° C./W |
| | Steam channel height | 0.8 mm | Steam channel height | 1.4 mm | | |
| Example 4 | Sintered metal thickness | 1.3 mm | Sintered metal thickness | 0.20 mm | 120 W | 0.66° C./W |
| | Steam channel height | 0.8 mm | Steam channel height | 1.5 mm | | |
| Example 5 | Sintered metal thickness | 1.0 mm | Sintered metal thickness | 0.20 mm | 120 W | 0.64° C./W |
| | Steam channel height | 1.4 mm | Steam channel height | 1.5 mm | | |
| Example 6 | Sintered metal thickness | 1.3 mm | Sintered metal thickness | 0.15 mm | 120 W | 0.68° C./W |
| | Steam channel height | 0.8 mm | Steam channel height | 1.6 mm | | |
| Example 7 | Sintered metal thickness | 1.3 mm | Sintered metal thickness | 0.10 mm | 110 W | 0.70° C./W |
| | Steam channel height | 0.8 mm | Steam channel height | 1.7 mm | | |

According to Table 1, in a configuration in which the groove wick 34 having flow resistance relatively smaller than the flow resistance of the porous sintered metal 31 was provided as the second wick 22, compared with the existing configuration in which the porous sintered metal 31 was provided as the first wick 21 and the second wick 22, an improvement effect of heat transfer characteristics was obtained in that the maximum heat transfer amount was increased to 1.5 times and approximately 0.2 degree/W was reduced in the heat resistance.

Further, among the configurations in which the groove wick 34 including the plurality of groove sections 33 extend- In Example B, the boundary section 23 between the first wick 21 and the second wick 22 is provided in a position further shifted to the other end 11B side of the heat pipe 11 than the reference line 50 described above. Specifically, the boundary section 23 is provided in a position moved a predetermined distance L (20 mm) to the other end 11B side of the heat pipe 11 from the reference line 50. The configuration other than the position of the boundary section 23 of the heat pipe 11 is the same as the configuration in Example 5 explained above.

EXAMPLE C

Figure 7:
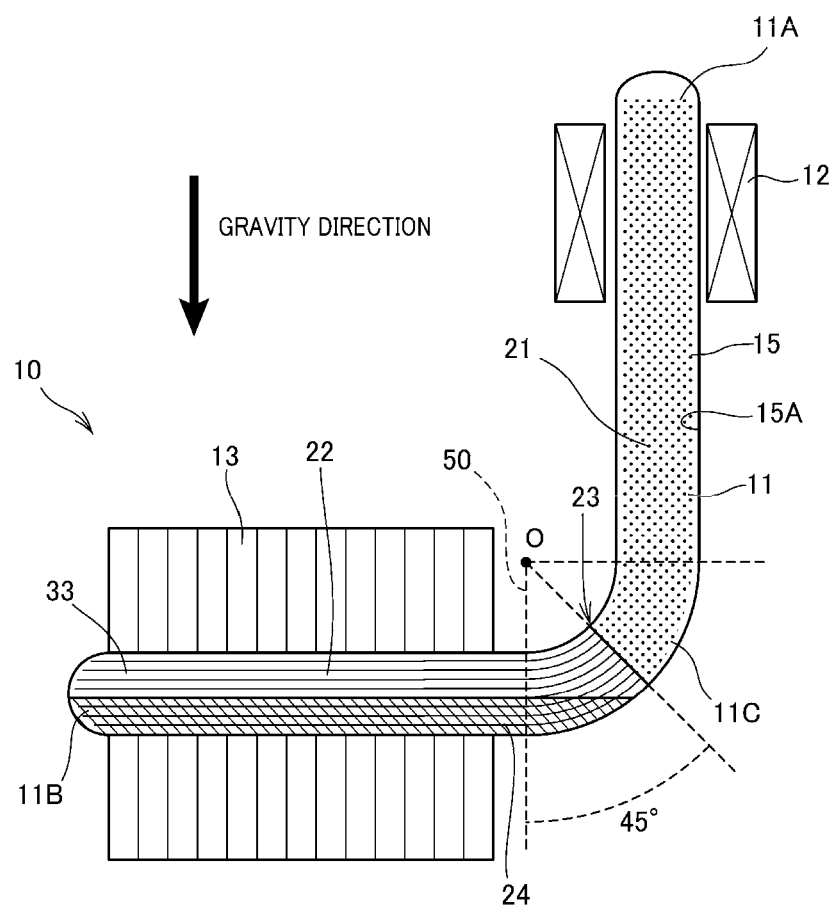
FIG. 7 is a schematic diagram of an internal structure of a heat transfer device according to Example C.

FIG. 7 is a schematic diagram of an internal structure of a heat transfer device according to Example C.

In Example C, the boundary section 23 between the first wick 21 and the second wick 22 is provided in a position of 45 degrees in the gravity direction with respect to the bent section 11C. Specifically, the boundary section 23 is provided in a position where the angle formed by the reference line 50 and the boundary section 23 is 45 degrees.

The configuration other than the position of the boundary section 23 of the heat pipe 11 is the same as the configuration in Example 5 explained above.

EXAMPLE D

Figure 8:
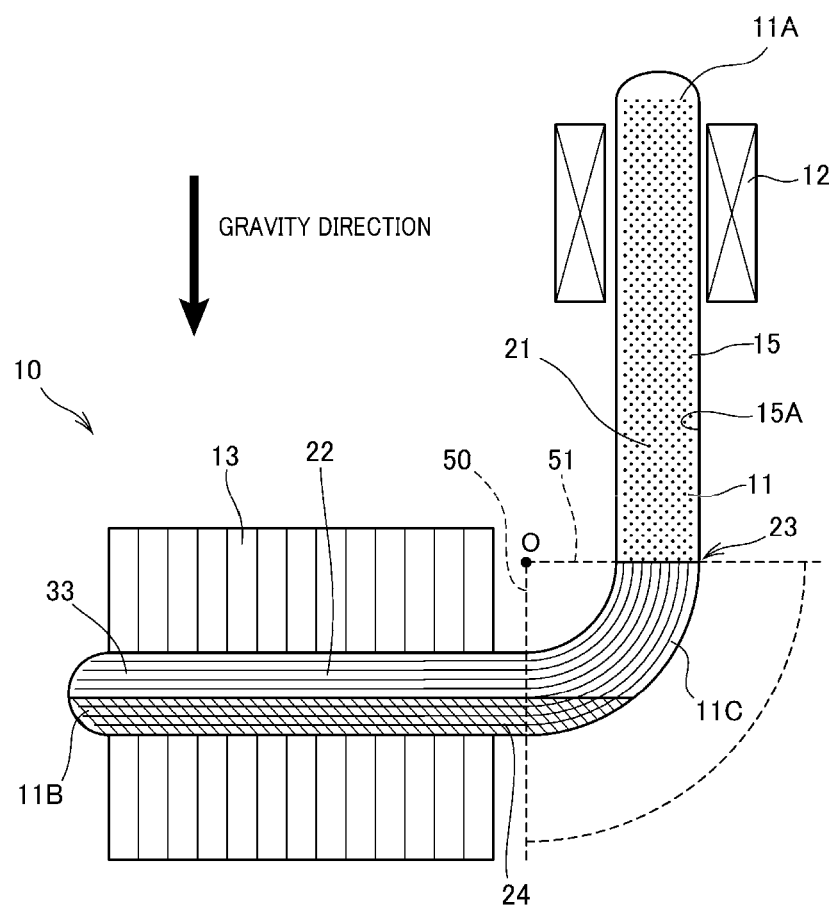
FIG. 8 is a schematic diagram of an internal structure of a heat transfer device according to Example D.

FIG. 8 is a schematic diagram of an internal structure of a heat transfer device according to Example D.

In Example D, the boundary section 23 between the first wick 21 and the second wick 22 is provided in a position of 90 degrees in the gravity direction with respect to the bent section 11C. Specifically, the boundary section 23 is provided such that the angle formed by the reference line 50 and the boundary section 23 is 90 degrees, that is, the boundary section 23 is located on a horizontal reference line 51 extending in the horizontal direction from the bending center O of the bent section 11C.

The configuration other than the position of the boundary section 23 of the heat pipe 11 is the same as the configuration in Example 5 explained above.

Values of the maximum heat transfer amount and the heat resistance between the heater and the room temperature (a relation between a wick boundary setting position and characteristics) in Examples A to D are shown in Table 2.

TABLE 2

| | Setting position of the wick boundary with respect to the gravity direction | Maximum heat transfer amount | Heat resistance between the heater and the room temperature |
|---|---|---|---|
| Example A (Same as Example 5) | 0 degree | 120 W | 0.64° C./W |
| Example B | 0 degree (Set the wick boundary in a position 20 mm from the reference line) | 120 W | 0.68° C./W |
| Example C | 45 degrees | 115 W | 0.70° C./W |
| Example D | 90 degrees | 80 W | 0.88° C./W |

With this configuration, in Examples A to C in which the boundary section 23 is provided in the positions of the angles smaller than 45 degrees in the gravity direction with respect to the bent section 11C, compared with Example D in which the boundary section 23 is provided in the position of 90 degrees in the gravity direction with respect to the bent section 11C, an improvement effect of heat transfer characteristics was obtained in that the maximum heat transfer amount was increased to 1.5 times and approximately 0.2 degree/W was reduced in the heat resistance.

It is possible to soak the boundary section 23 in the working fluid 24 by configuring the heat pipe 11 such that the boundary section 23 between the first wick 21 and the second wick 22 is located in the lower part in the gravity direction in this way. Therefore, with the capillary pressure of the first wick 21, the first wick 21 plays a role of a pump that refluxes the working fluid 24 to a high position and the second wick 22 plays a role of a water feed pipe for quickly feeding the working fluid 24 from a liquid reservoir to the first wick 21. Efficient working fluid circulation is performed. Consequently, reflux of the working fluid 24 to the one end 11A side of the heat pipe 11, where the heat receiving plate 12 is provided, is facilitated. Therefore, it is possible to improve heat transfer efficiency with a simple configuration.

A modification of this embodiment is explained.

Figure 9:
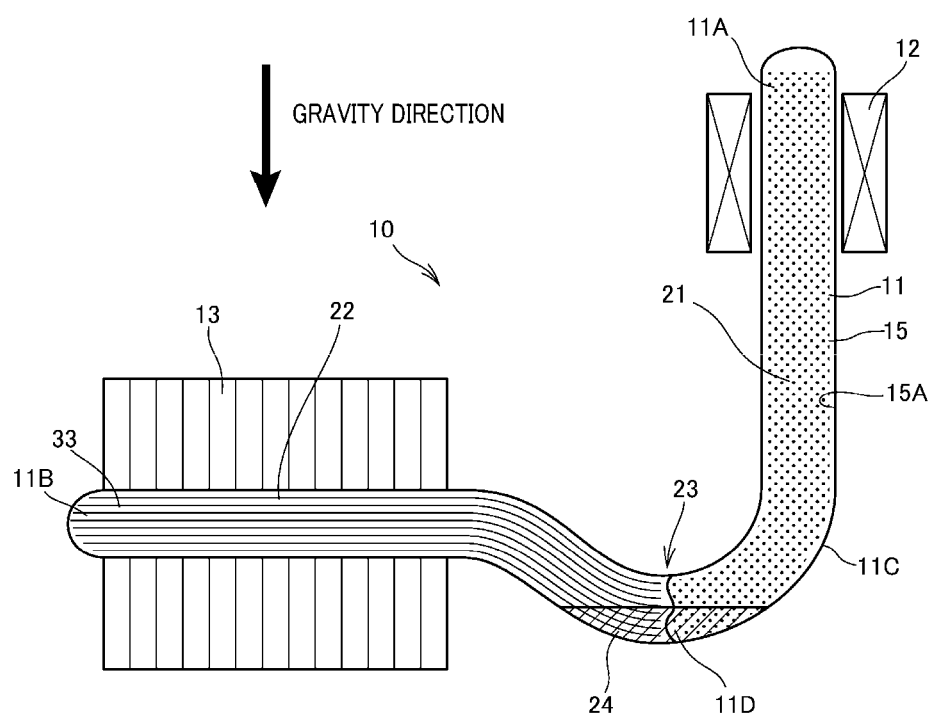
FIG. 9 is a schematic diagram of an internal structure of a heat transfer device according to a modification of the embodiment.

FIG. 9 is a schematic diagram of an internal structure of the heat transfer device 10 according to the modification.

In this configuration, as shown in FIG. 9, the heat pipe 11 includes the bent section 11C between the one end 11A and the other end 11B, and in turn the bent section 11C includes a storing section 11D that is located at the bottom in the gravity direction in the heat pipe 11 and stores the working fluid 24. The boundary section 23 between the first wick 21 and the second wick 22 is formed to be located in the storing section 11D of the bent section 11C.

In this configuration, the working fluid 24 condensed in the heat radiating fin 13 on the other end 11B side of the heat pipe 11 flows to the storing section 11D through the second wick 22 and is stored in the storing section 11D. Consequently, the working fluid 24 stored in the storing section 11D is always in a state in which the working fluid 24 soaks the first wick 21. Therefore, reflux of the working fluid 24 to the one end 11A side of the heat pipe 11, where the heat receiving plate 12 is provided, is facilitated. It is possible to further improve the heat transfer efficiency.

Another embodiment is explained.

Figure 10:
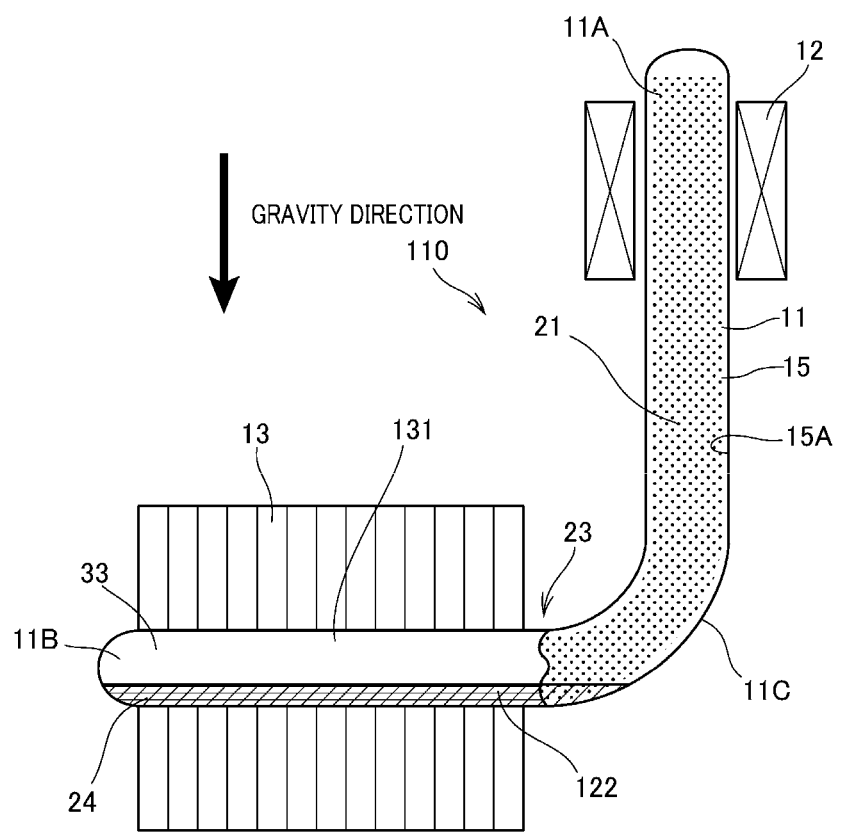
FIG. 10 is a schematic diagram of an internal structure of a heat transfer device according to another embodiment.

FIG. 10 is a schematic diagram of an internal structure of a heat transfer device 110 according to the other embodiment.

In the embodiment explained above, the configuration is explained in which, as the second wick 22 having the relatively small flow resistance, the groove wick 34 including the plurality of groove sections 33 extending in the longitudinal direction is provided on the other end 11B side of the heat pipe 11. However, a second wick 122 having a different configuration may be provided as long as the second wick 122 has relatively small flow resistance.

In the other embodiment, a configuration may be adopted in which metal braded wires 131 are provided as the second wick 122. The metal braded wires 131 are obtained by forming a plurality of metal thin wires in a net shape. The metal braded wires 131 are formed to have small flow resistance compared with the porous sintered metal 31 of the first wick 21.

Figure 11:
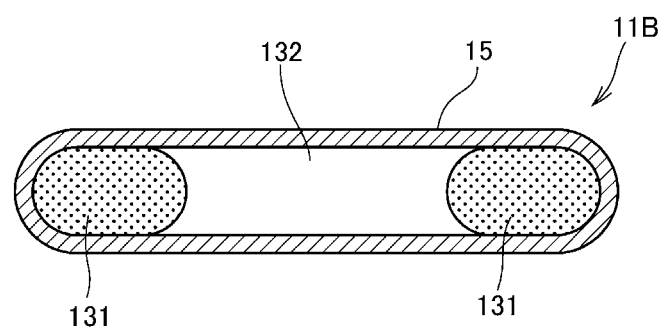
FIG. 11 is a sectional view of the other end side of a heat pipe according to Example 8.

As shown in FIG. 11, the metal braded wires 131 are respectively disposed on both end sides in the width direction of the other end 11B pressed and flattened. A steam channel 132 is formed in the center of the other end 11B. Note that the metal braded wire 131 may be provided at one end in the width direction. A configuration may be adopted in which a metal wire mesh or a fine metal net is disposed as the second wick 122. The configuration including the storing section 11D explained above may be combined with the heat pipe 11 of the other embodiment.

EXAMPLE 8

In Example 8, as metal braded wires, two metal braded wires each obtained by forming two hundred fifty metal thin wires (element wires ϕ0.06 mm) in a net shape were used. The metal braded wires 131 were respectively disposed on both the end sides in the width direction of the other end 11B. The other configuration excluding the other end 11B side is the same as the configuration in Example 2.

Still another embodiment is explained.

Figure 12:
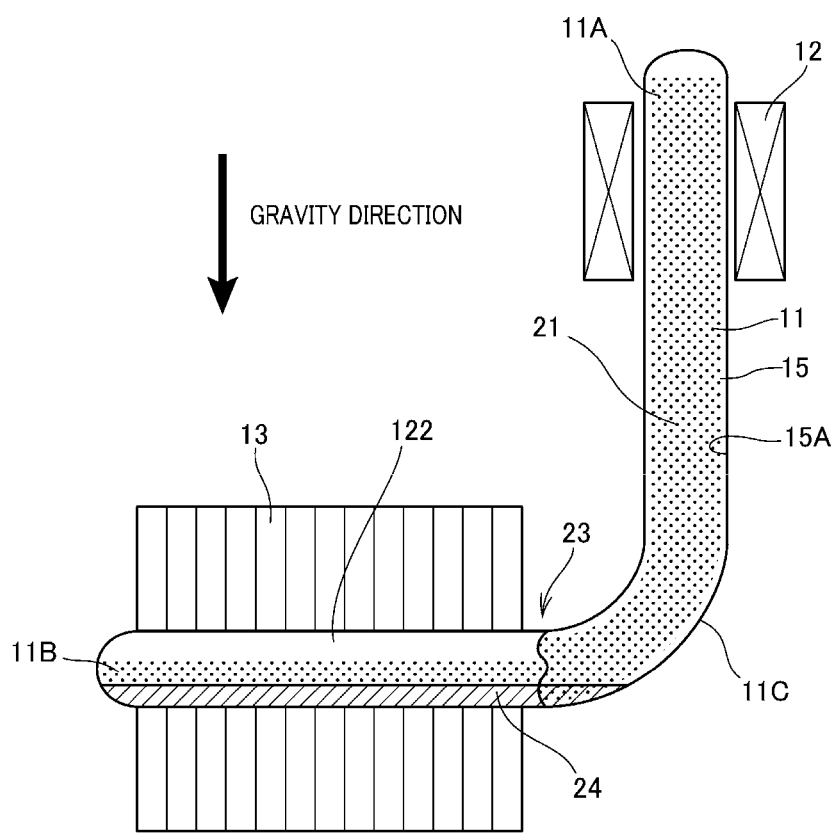
FIG. 12 is a schematic diagram of an internal structure of a heat transfer device according to still another embodiment.

FIG. 12 is a schematic diagram of an internal structure of a heat transfer device 210 according to the other embodiment.

Figure 13:
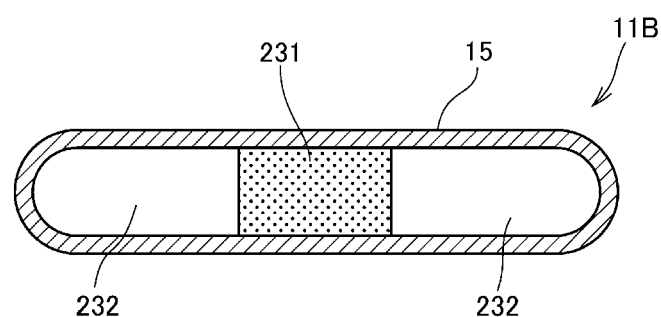
FIG. 13 is a sectional view of the other end side of the heat pipe.

In the other embodiment, the heat transfer device 210 includes, as a second wick 222, a porous sintered metal 231 obtained by sintering a spherical powder or deformed powder on the other end 11B side of the heat pipe 11. As shown in FIG. 13, the porous sintered metal 231 is provided in the width direction center of the heat pipe 11. Steam channels 232 are formed on the left and the right sides inside the heat pipe 11 across the porous sintered metal 231.

The configuration including the storing section 11D may be combined with the heat pipe 11 of the other embodiment.

EXAMPLE 9

Figure 14:
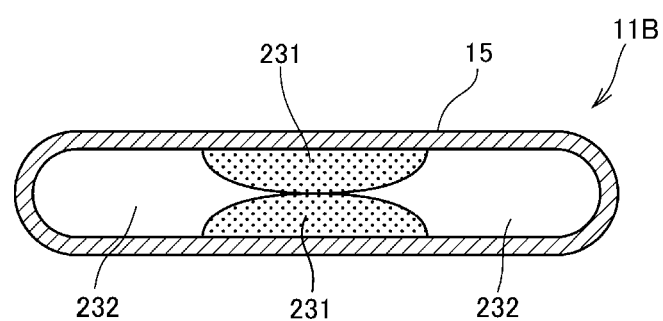
FIG. 14 is a sectional view of the other end side of a heat pipe according to Example 9.

FIG. 14 is a sectional view on the other end 11B side of the heat pipe 11 according to Example 9.

In Example 9, one or more porous sintered metals 231, 231 having a semielliptical shape and obtained by sintering a spherical powder or deformed powder are provided in the width direction center of the heat pipe 11 with arcuate surfaces on an ellipse side thereof opposed to each other. Specifically, in the porous sintered metals 231 having the elliptical shape, width is set to 6 mm and the height of the two porous sintered metals 231 laid one on top of the other is set to 0.95 mm. The other configuration excluding the other end 11B side is the same as the configuration in Example 2.

Values of the maximum heat transfer amount and the heat resistance between the heater and the room temperature in Examples 8 and 9 are shown in Table 3.

TABLE 3

|  | One end (heat receiving section) side Thickness 4.0 mm Wick type | | The other end (condensing section) side Thickness 2.5 mm Wick type | Maximum heat transfer amount | Heat resistance between the heater and the room temperature |
| --- | --- | --- | --- | --- | --- |
| Example 8 | Sintered metal thickness | 1.0 mm | Metal braded wire | 115 W | 0.73° C./W |
|  | Steam channel height | 1.4 mm | Element wire φ0.06 × 250 × two sets | | |
| Example 9 | Sintered metal thickness | 1.0 mm | Wick set in the center | 130 W | 0.60° C./W |
|  | Steam channel height | 1.4 mm | Width 6 mm/ thickness 0.95 mm | | |

In Examples 8 and 9, the metal braded wires 131 or the porous sintered metals 231 are provided as the second wick 122 provided on the inner wall surface 15A at the other end 11B of the heat pipe 11. Therefore, compared with the configuration in Example 2, an improvement effect of heat transfer characteristics was obtained in that the maximum heat transfer amount was increased to 1.5 times or more and approximately 0.2 degree/W was reduced in the heat resistance.

In particular, a reason why Example 9 is satisfactory is considered to be that, in addition to capillarity of the porous sintered metals 231, 231 having the semielliptical shape, an acute angel section is formed by contact of the arcuate surfaces, and additional capillarity and low flow resistance like those in grooves are achieved in the part of the acute angle section.

The present invention is specifically explained above on the basis of the embodiments. However, the present invention is not limited to the embodiments and can be changed in a range not departing from the spirit of the present invention.

For example, the configuration is explained above in which the heat transfer devices 10, 110, and 210 are in the top heat mode in which the heat receiving plate 12 is located in the upper part in the gravity direction. However, it is evident that the invention of this application may be applied to a configuration of a bottom heat mode in which the heat receiving plate 12 is located in a lower part in the gravity direction.

REFERENCE SIGNS LIST 10, 110, 210 heat transfer device
11 heat pipe
11A one end
11B the other end
11C bent section
11D storing section
12 heat receiving plate (heat receiving section)
13 heat radiating fin (heat radiating section)
14 heat generating element (cooling target component)
15 container
15A inner wall surface (inner wall)
21 first wick
22, 122, 222 second wick
23 boundary section
24 working fluid
31, 231 porous sintered metal
32, 132, 232 steam channel
33 groove section
34 groove wick
131 metal braded wire

The invention claimed is:

1. A heat transfer device comprising:

a heat pipe in which working fluid is enclosed, a heat receiving section being provided on one end side of the heat pipe and a heat radiating section being provided on another end side of the heat pipe, wherein on an inner wall of the heat pipe, a first wick disposed in the heat receiving section of the heat pipe and a second wick is disposed in the heat radiating section of the heat pipe, a bent section bent between the heat receiving section and the heat radiating section is provided, a boundary section between the first wick and the second wick is disposed below the bent section in a gravity direction, and the heat receiving section is disposed above the bent section in a direction of a pull of gravity, the working fluid is stored in a liquid reservoir that includes the second wick and the boundary section between the first wick and the second wick, the liquid reservoir being formed at a lowest point of the bent section in the direction of the pull of gravity, an end portion of the first wick is directly connected to an end portion of the second wick at the boundary section between the first wick and the second wick, the boundary section corresponds to a lower part of the bent section in the direction of the pull of gravity, the first wick and the second wick always being soaked by the working fluid in the liquid reservoir, capillary pressure in the first wick causes some of the working fluid to reflux to the heat receiving section, and capillary pressure in the second wick causes some of the working fluid to be supplied to the first wick.

2. The heat transfer device according to claim 1, wherein the second wick includes a plurality of groove sections extending in a longitudinal direction on the inner wall of the heat pipe.

3. The heat transfer device according to claim 2, wherein depth of the groove sections is set to 0.10 to 0.20 mm.

4. The heat transfer device according to claim 2, wherein depth of the groove sections is a depth of 30% to 70% with respect to a wall thickness of the heat pipe.

5. The heat transfer device according to claim 1, wherein the first wick includes porous sintered metal obtained by sintering a spherical powder or deformed powder.

6. The heat transfer device according to claim 1, wherein the second wick includes a metal braded wire or a metal net.

7. The heat transfer device according to claim 1, wherein the second wick includes, in a width direction center of the heat pipe, porous sintered metal obtained by sintering a spherical powder or deformed powder, and steam channels are formed on left and right sides inside the heat pipe across the porous sintered metal.

8. The heat transfer device according to claim 1, wherein the second wick includes, in a width direction center of the heat pipe, one or more semielliptical porous sintered metals obtained by sintering a spherical powder or deformed powder, a flat section of each semielliptical porous sintered metal is disposed on the inner wall of the heat pipe, steam channels are formed on left and right sides inside the heat pipe across the semielliptical porous sintered metals.

9. The heat transfer device according to claim 1, wherein an end side the heat pipe that is opposite the one end side of the heat pipe is pressed and flattened to be thinner than the one end side of the heat pipe.

* * * * *